United States Patent [19]
Verhaverbeke et al.

[11] Patent Number: 6,132,522
[45] Date of Patent: *Oct. 17, 2000

[54] WET PROCESSING METHODS FOR THE MANUFACTURE OF ELECTRONIC COMPONENTS USING SEQUENTIAL CHEMICAL PROCESSING

[75] Inventors: Steven Verhaverbeke, Radnor; Christopher F. McConnell, Berwyn; Charles F. Trissel, West Chester, all of Pa.

[73] Assignee: CFMT, Inc., Wilmington, Del.

[ * ] Notice: This patent issued on a continued prosecution application filed under 37 CFR 1.53(d), and is subject to the twenty year patent term provisions of 35 U.S.C. 154(a)(2).

[21] Appl. No.: 08/684,543

[22] Filed: Jul. 19, 1996

[51] Int. Cl.⁷ ................................................ B08B 7/04
[52] U.S. Cl. ........................... 134/26; 134/10; 134/95.1; 216/99; 438/689; 438/698; 438/704; 438/706; 438/734; 438/749; 156/345
[58] Field of Search .................... 438/689, 698, 438/704, 706, 734, 749; 156/345; 134/10, 26, 94.1, 95.1, 95.2, 95.3; 216/99

[56] References Cited

U.S. PATENT DOCUMENTS

| | | | |
|---|---|---|---|
| 3,650,960 | 3/1972 | Strauss et al. | 252/79.3 |
| 4,277,290 | 7/1981 | Andrews et al. | 134/10 |
| 4,498,953 | 2/1985 | Cook et al. | 156/646 |

(List continued on next page.)

FOREIGN PATENT DOCUMENTS

| | | |
|---|---|---|
| 5-190526 | 7/1993 | Japan. |
| WO 87/00094 | 1/1987 | WIPO. |

OTHER PUBLICATIONS

Kern, W. "Overview and Evolution of Semiconductor Wafer Contamination and Cleaning Technology", Handbook of Semiconductor Wafer Cleaning Technology, Kern, W. (Ed.), Noyes Publications, Parkridge, NJ, 1993, Chapter 1, 3–67.

Burkman et al., "Aqueous Cleaning Processes", Handbook of Semiconductor Wafer Cleaning Technology, Kern, W. (Ed.), Noyes Publications, Parkridge, NJ, 1993, Chapter 3, 111–151.

"Full–Flow™ Wet Processing" brochure, 1993, CFM Technologies, Inc., West Chester, PA.

"CFM Technologies. The Next Generation in Wet Processing" brochure, CFM Technologies, West Chester, PA.

Horiki, H. et al., "Wet Etch Cleaning" in *Ultraclean Technology Handbook*, vol. 1, 805–819.

Gise, P. et al., "Semiconductor and Integrated Circuit Fabrication Techniques", 1979, Reston Publishing Co., Reston, VA.

Kern, W. "Overview and Evolution of Semiconductor Wafer Contamination and Cleaning Technology", Handbook of Semiconductor Wafer Cleaning Technology, Kern, W. (Ed.), Noyes Publication, Parkridge, NJ, 1993, Chapter 1.

Burkman et al., "Wet Chemical Processes–Aqueous Cleaning Processes", Handbook of Semiconductor Wafer Cleaning Technology, Kern, W. (Ed.), Noyes Publication, Parkridge, NJ, 1993, Chapter 3, 111–151.

Bennett "Concise chemical and technical dictionary" Chem. Pubsh. p. 473, 1976.

Horne "Microcircuit production technology" Adam Hilger Ltd., pp. 89–90, 1986.

*Primary Examiner*—Ceila Chang
*Attorney, Agent, or Firm*—Woodcock Washburn Kurtz MacKiewicz & Norris LLP

[57] ABSTRACT

The present invention is directed to wet processing methods for the manufacture of electronic component precursors, such as semiconductor wafers used in integrated circuits. More specifically, this invention relates to methods, for example, prediffusion cleaning, stripping, and etching of electronic component precursors using sequential chemical processing techniques.

18 Claims, 4 Drawing Sheets

U.S. PATENT DOCUMENTS

| | | | |
|---|---|---|---|
| 4,560,417 | 12/1985 | Bardina et al. | 134/1 |
| 4,577,650 | 3/1986 | McConnell | 134/59 |
| 4,582,390 | 4/1986 | Furuya | 350/96.12 |
| 4,633,893 | 1/1987 | McConnell et al. | 134/95.2 |
| 4,654,089 | 3/1987 | Singelyn et al. | 134/26 |
| 4,711,256 | 12/1987 | Kaiser | 134/25.4 |
| 4,738,272 | 4/1988 | McConnell | 134/59 |
| 4,740,249 | 4/1988 | McConnell | 134/25.4 |
| 4,761,244 | 8/1988 | Scardera et al. | 252/79.3 |
| 4,778,532 | 10/1988 | McConnell et al. | |
| 4,795,497 | 1/1989 | McConnell et al. | 134/18 |
| 4,856,544 | 8/1989 | McConnell | 134/95.1 |
| 4,902,608 | 2/1990 | Lamb et al. | 430/325 |
| 4,911,761 | 3/1990 | McConnell et al. | 134/11 |
| 4,917,123 | 4/1990 | McConnell et al. | 134/95.1 |
| 4,921,572 | 5/1990 | Roche | 156/653 |
| 4,984,597 | 1/1991 | McConnell et al. | 134/95.1 |
| 5,075,256 | 12/1991 | Wang et al. | 437/225 |
| 5,101,457 | 3/1992 | Blonder et al. | 385/33 |
| 5,148,823 | 9/1992 | Bran | 134/184 |
| 5,169,408 | 12/1992 | Biggerstaff et al. | 29/25.01 |
| 5,174,855 | 12/1992 | Tanaka | 216/99 |
| 5,200,024 | 4/1993 | Blonder et al. | 156/628 |
| 5,213,650 | 5/1993 | Wang et al. | 156/345 |
| 5,242,468 | 9/1993 | Clark et al. | 29/25.01 |
| 5,273,609 | 12/1993 | Moslehi | 456/345 |
| 5,286,657 | 2/1994 | Bran | 437/9 |
| 5,292,273 | 3/1994 | Arita et al. | 134/2 |
| 5,301,701 | 4/1994 | Nafziger | 134/95.2 |
| 5,308,400 | 5/1994 | Chen | 134/2 |
| 5,311,892 | 5/1994 | Adelt et al. | 134/58 |
| 5,370,741 | 12/1994 | Bergman | 134/3 |
| 5,381,808 | 1/1995 | Kamikawa | 134/61 |
| 5,383,484 | 1/1995 | Thomas et al. | 134/184 |
| 5,389,551 | 2/1995 | Kamakura et al. | 437/10 |
| 5,393,694 | 2/1995 | Mathews | 437/72 |
| 5,393,712 | 2/1995 | Rostoker et al. | 437/238 |
| 5,419,351 | 5/1995 | Ciari | 134/95.2 |
| 5,425,826 | 6/1995 | Sayyadi et al. | 156/73.1 |
| 5,425,846 | 6/1995 | Koze et al. | 156/646.1 |
| 5,435,885 | 7/1995 | Jones et al. | 216/92 |
| 5,448,672 | 9/1995 | Blonder et al. | 385/123 |
| 5,460,691 | 10/1995 | Kobayashi et al. | 156/646.1 |
| 5,511,569 | 4/1996 | Mukogawa | 134/104.1 |
| 5,522,412 | 6/1996 | Ohba et al. | 134/104.1 |
| 5,567,574 | 10/1996 | Hasemi et al. | 430/331 |
| 5,571,644 | 11/1996 | Uraguchi et al. | 430/30 |
| 5,578,532 | 11/1996 | van de Ven et al. | 437/245 |
| 5,598,493 | 1/1997 | Bonham, Jr. et al. | 385/33 |
| 5,600,174 | 2/1997 | Reay et al. | 257/467 |
| 5,605,602 | 2/1997 | DeBusk | 156/646.1 |
| 5,645,737 | 7/1997 | Robinson et al. | 216/99 |
| 5,810,940 | 9/1998 | Fukazawa et al. | 134/3 |

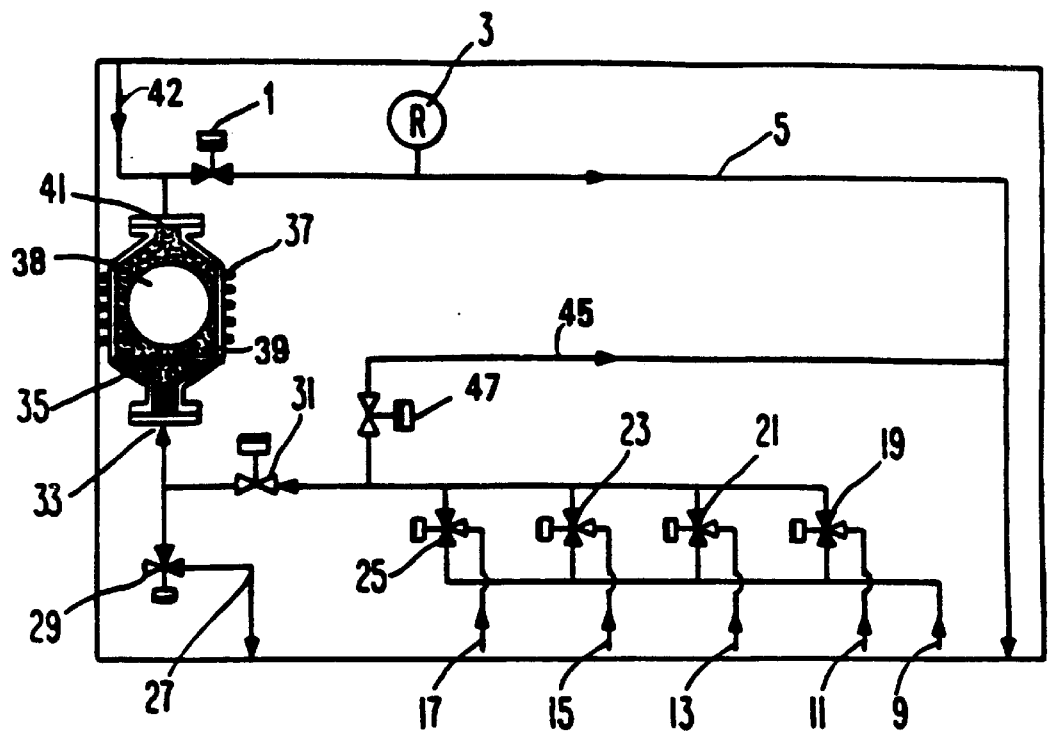
PRIOR ART   *Fig. 1*
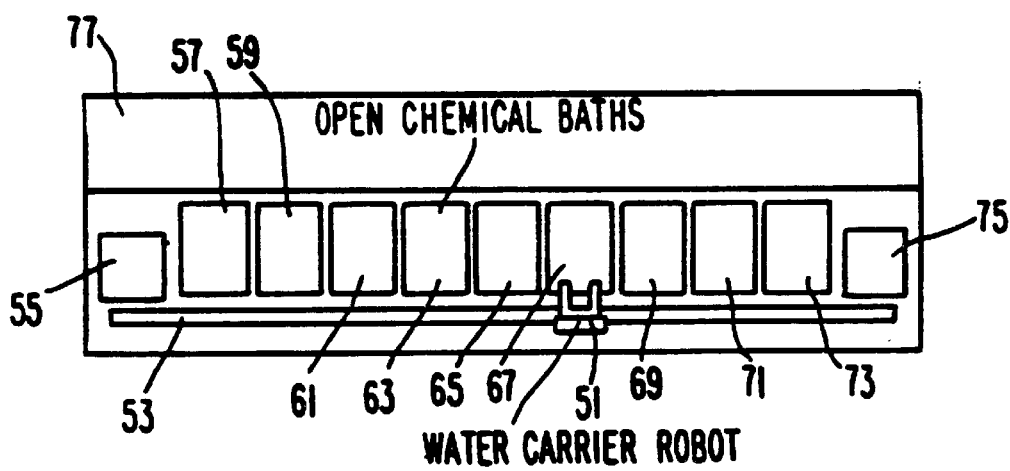
PRIOR ART   *Fig. 2*

6,132,522

1

WET PROCESSING METHODS FOR THE MANUFACTURE OF ELECTRONIC COMPONENTS USING SEQUENTIAL CHEMICAL PROCESSING

FIELD OF THE INVENTION

The present invention is directed to wet processing methods for the manufacture of electronic components, such as semiconductor wafers used in integrated circuits. More specifically, this invention relates to methods, for example, cleaning, stripping, and etching of electronic component precursors using sequential chemical processing techniques.

BACKGROUND OF THE INVENTION

Wet processing is used extensively during the manufacture of integrated circuits, which typically comprise electronic component precursors such as semiconductor wafers, flat panels, and the like. Generally, the electronic component precursors are placed in a bath or a vessel and then contacted with a series of reactive chemical process fluids and/or rinsing fluids. The process fluids may be used, without limitation, for etching, photoresist stripping, prediffusion cleaning and other cleaning of the electronic component precursors. See, e.g., U.S. Pat. Nos. 4,577,650; 4,740,249; 4,738,272; 4,856,544; 4,633,893; 4,775,532; 4,917,123; and EPO 0 233 184, assigned to a common assignee, and Burkman et al., *Wet Chemical Processes-Aqueous Cleaning Processes*, pg 111–151 in Handbook of Semiconductor Wafer Cleaning Technology (edited by Werner Kern, Published by Noyes Publication Parkridge, N.J. 1993), the disclosures of which are herein incorporated by reference in their entirety.

For example, electronic component precursors are exposed to reactive chemical process fluids to either dissolve contamination on the electronic component precursors or to etch some part of the surface. After this dissolving or etching is performed, the chemical will adhere to the surface of the electronic component precursors. The adhered chemical must then be rinsed from the surface of the electronic component precursors before treating the electronic component precursors with the next reactive chemical process fluid so that the chemical residue on the precursors does not contaminate the next reactive chemical process fluid. For process control, it is important that the two different process fluids not be mixed together because otherwise the concentration of the second reactive chemical process fluid will be continually diluted by the first reactive chemical process fluid. Additionally, when the chemical treatment steps are carried out in a bath, contamination from one bath could be transferred to the next. Therefore, in current wet processing techniques, a rinse with deionized (DI) water is always performed between each chemical treatment step (i.e., contacting precursors with a reactive chemical process fluid), whether the chemical treatment is done in a bath, full flow vessel, spray chamber, or using other wet bench techniques.

The DI rinse removes the given chemical from the surface of the electronic component precursors after the chemical has performed its function (e.g., cleaning or etching). The DI rinse is also performed to prevent mixing of the reactive chemical process fluids and to prevent one reactive chemical process fluid from contaminating the next reactive chemical process fluid. However, this rinsing step imposes several limitations on the manufacture of electronic components.

It is standard in the industry to rinse the electronic component precursors between chemical treatment steps with DI water until the level of dissolved chemicals is about 10 p.p.b. (i.e., 4–16 Mohm-cm). This requires extensive rinsing. Because DI water tends to be very expensive, rinsing substantially increases the costs of manufacturing electronic component precursors. DI rinsing also takes a long time, sometimes consuming as much as 60% of the total wet processing time, therefore decreasing throughput of the electronic component precursors.

The rinse with DI water can also compromise the integrity of the wet processing techniques. For example, it has been observed that rinsing electronic component precursors with DI water between certain chemical treatment steps causes the formation of undesirable oxide, silica, and/or metal precipitates. Without being bound to any specific mechanism, it is believed that when electronic component precursors are treated with, for example, a first basic process fluid, such as ammonium hydroxide and hydrogen peroxide (SC1), this process fluid etches the silicon surface of, for example, the wafer by growing an oxide on the wafer's surface and then by dissolving the oxide with the ammonia. It is only the hydroxyl (OH-) (or alternatively said, the pH) of the dissociated ammonium hydroxide ($NH_4OH$) molecule that dissolves the oxide. The reaction product of SC1 is $SiO_3^{2-}$, which is a soluble ion at high pH (and low pH fluoride solutions (i.e., hydrofluoric acid (HF)), an thus, results in a solution of dissolved silica. However, silica precipitates out in the presence of seeds such as iron at neutral pH (i.e., rinse water), and it is not uncommon to have neutral conditions occur during rinsing in any standard wet processing method.

Generally, after the wafers are treated with the first basic process fluid (as discussed above) or any other process fluid, a DI rinse is typically done to remove the chemicals from the surfaces of the wafers. Because the DI rinse tends to decrease the pH of the resultant solution (discussed above), which in turn decreases the solubility of the silica, precipitation of silica generally occurs with rinsing (due to the co-precipitation of silica and metal precipitates in the chemical solution), with the metal ions acting to "seed" this precipitation reaction. The materials thought to be most responsible for the precipitation in the ammonium hydroxide/hydrogen peroxide process fluid are Fe, Al, and Zn. Other precipitate forming metals in this solution are Pb, Cu, Ni, Hg, and Cr. These metals are trace contaminates in chemicals used in electronic component precursor wet processing.

The amount of material needed for precipitate formation is extremely small. For example, for an impurity concentration of 0.1 p.p.b. of Fe in the reaction chamber, there is $1e^{-6}$ g of Fe. At pH 7 and higher, and air saturated water, Fe is found in the form of $Fe_2O_3$ or $FeOH_3$. Consider $Fe_2O_3$ (the results are comparable for $FeOH_3$): the density of $Fe_2O_3$ is 5.24 $g/cm^3$, which after precipitation yields $2.7e^{-7}$ $cm^3$ in total volume of $Fe_2O_3$. If every seed is assumed to be a cube with a side dimension of 0.1 $\mu$m. (This is an extremely conservative assumption, since seeds can actually have a much smaller volume). Then there is enough material to make 270,000,000 seeds. Each of these seeds will coagulate the silica (an etch product of SC1) and result in the formation of precipitates. This phenomenon is observed in both wet bench techniques (baths), and in full flow methods. It has been observed that all of these precipitates are formed in the rinsing after treatment with SC1. This is unacceptable for wet chemical processing techniques.

Although the precipitates may be reduced if the DI rinse is done for a long period of time and at elevated temperature, this is not an acceptable solution due to the resulting increased costs and lower output of electronic component precursors.

Thus, there is a need in the art for a simple and efficient method that permits the safe chemical treatment of electronic component precursors, while at the same time eliminating the problems and costs associated with DI rinsing between chemical treatment steps. The present invention addresses these as well as other needs.

SUMMARY OF THE INVENTION

The invention presents, inter alia, wet processing methods useful in the manufacture of electronic component precursors, such as semiconductor wafers and flat panels, used in integrated circuits. These novel methods can be used for the cleaning, stripping, and/or etching of such electronic component precursors.

It has been discovered that eliminating the DI rinse between each chemical treatment step minimizes precipitation of the silica, metal, and/or oxide precipitates. In contrast to the wet processing methodologies available in the art, which focus on rinsing the electronic component precursors with DI water between each chemical treatment step, the present invention eliminates the need for the DI rinse by using a sequential chemical methodology.

The invention presents methods for the manufacture of electronic component precursors comprising placing the electronic component precursors in a reaction chamber and contacting the surfaces of said electronic component precursors with a series of reactive chemical process fluids for a selected period of time without removing the electronic component precursors from the reaction chamber, wherein said contacting comprises sequentially exposing said electronic component precursors to at least two reactive chemical process fluids.

In particular, according to methods of the invention, one reactive chemical process fluid can be introduced into a reaction chamber (i.e., bath or vessel) in which the electronic component precursors are chemically treated by gradually displacing one reactive chemical process fluid from the chamber (in particular, from the surfaces of the electronic component precursors) with another reactive chemical process fluid without moving the electronic component precursors from the reaction chamber or without draining the reaction chamber of the previous process fluid. It is also contemplated, however, that the reaction chamber can be drained of one reactive chemical process fluid which is then followed by the introduction into the chamber of another reactive chemical process fluid without rinsing the surfaces of the electronic component precursors between the different chemical treatment steps.

The methods may further comprise the step of drying the electronic component precursors. This drying may be done, for example, by evacuating or displacing said reactive chemical process fluids or any rinsing fluids from the reaction chamber with a drying vapor, or drying the electronic component precursors by some other means, which would be readily known to persons skilled in the art.

In another aspect of the invention, the electronic component precursors are moved from one reaction chamber to another, wherein each reaction chamber contains a different reactive chemical process fluid. According to this aspect of the invention, after treating the electronic component precursors with one reactive chemical process fluid, the electronic component precursors are immediately immersed into the next reactive chemical process fluid contained in another reaction chamber without rinsing the electronic component precursors with a rinsing fluid to remove the previous reactive chemical process fluid from the surfaces of the electronic component precursors. It is contemplated, however, that the electronic component precursors can be immersed in a chamber containing a rinsing in between certain chemical treatment steps, but there must be at least two sequential treatments of the electronic component precursors with a reactive chemical process fluid.

The methods may further comprise the step of drying the electronic component precursors. This drying may be done, for example, by evacuating or displacing said reactive chemical process fluids or any rinsing fluids from the reaction chamber with a drying vapor, or drying the electronic component precursors by some other means, which would be readily known to persons skilled in the art.

The methods of the invention offer the advantages of higher output of electronic component precursors, such as wafers or flat panels, by eliminating the DI rinse between each chemical treatment step. This also results in a significant costs savings because DI water is very expensive. These are great benefits to the semiconductor manufacturing industry. These methods also result in improved process performance of electronic component precursors (i.e., wafers or panels are cleaner).

BRIEF DESCRIPTION OF THE DRAWINGS

Prior Art FIG. 1 is a schematic illustration of an apparatus that may be used in practicing an embodiment of the invention.

Prior Art FIG. 2 is a schematic illustration of an apparatus that may be used in practicing an embodiment of the invention.

FIG. 3a shows the average number of particles per wafer for each run. The top line is the maximum number of particles added on a single wafer while the bottom line indicates the average number of particles added for a lot. The lot size consisted of either 52 wafers (a full lot) per lot or 26 wafers per lot (a half lot). Within the industry the specifications for a hydrofluoric acid (HF) last process typically are no more than 50 particles (>0.16 μm) added per wafer. The data in FIG. 3b indicate that this specification can readily be met with sequential chemical processing.

DETAILED DESCRIPTION OF THE INVENTION

Figure 3A:
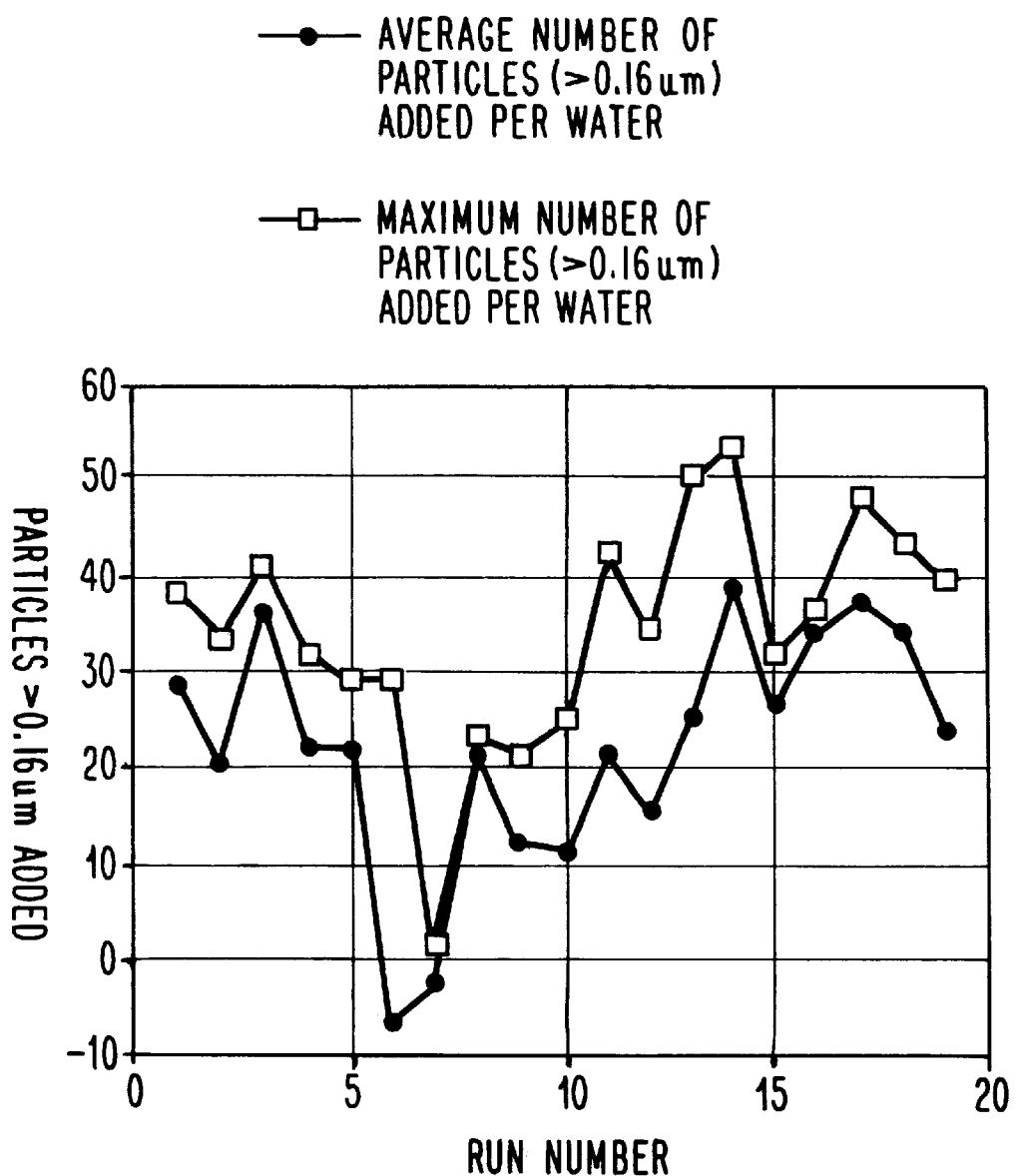
FIGS. 3a and 3b are graphical representations of the results of full and half loads of wafers without rinsing the wafers with DI water between the chemical treatment steps.

The terminology "reactive process fluid," "reactive chemical process fluid," "processing fluid," "chemical fluid," or "reactive chemical process fluid," as used herein, refers to the reactive fluids that electronic component precursors are exposed to during their manufacture and that perform some action on the surface electronic component precursors, as distinguished from a rinsing fluid such as DI water. These terms may be used interchangeably. Process fluids are frequently used repeatedly before being discarded, which is in contrast to rinsing fluids.

When used in connection with the terminology "process fluid," "reactive" means, without limitation, a process fluid that is active in removing contamination such as particulates, metallic impurities, or organics from the surface of the electronic component precursor, or active in etching the surface of the electronic component precursor, or active in growing an oxide layer on the surface of the electronic component precursor.

The terminology "rinsing fluid" or "rinse fluid," as used herein, refers to DI water or some other fluid that is used to rinse the electronic component precursors after exposure to a reactive chemical process fluid, as compared to treating them with a chemical. A rinse fluid may be DI water or a very dilute aqueous solution of a chemical (i.e., hydrochloric acid or hydrofluoric acid) to prevent, for example, metallic deposition on the surface of the electronic component precursors. Ozone is another additive used during rinsing. The chemical concentration in such rinsing fluids is minute; generally, the concentration is not greater than about 100 ppm. The primary goal of the rinsing fluid is to remove chemicals or reaction products from the surface of the electronic component precursors, and not to perform some "reactive" process. Rinsing fluids are generally discarded after each use, in contrast to reactive chemical process fluids.

The terminology "reaction chamber," as used herein, refers to vessels, full flow vessels, baths, wet benches, spray chambers, and other reservoirs suitable for wet processing methodologies.

The terminology "hydraulically full," is a term used by those skilled in the art and refers to the reaction chamber being full at all times during the manufacture of wafers or other electronic component precursors.

As used herein, the terminology "enclosed full flow method," refers, generally, to a method where process fluids flow sequentially and continuously past the electronic component precursors contained in a reaction chamber.

As used herein, the terminology "full flow vessel," refers to a vessel that is closed to the environment and is employed in a "full flow method."

As used herein, the terminology "electronic component precursors" includes, without limitation, semiconductor wafers, flat panels, flat panel display substrates, and other components used in the manufacture of electronic components (i.e., integrate circuits).

The terminology "sequential chemical process," "sequentially exposing" or "sequential," as used herein, refers to a process where the electronic component precursors are continually exposed to reactive chemical process fluids either by being sequentially immersed in reactive chemical process fluids without rinsing the electronic component precursors (i.e., their surfaces) with DI water in between the chemical treatment steps; or by flowing, in a sequential manner, reactive chemical process fluids past the electronic component precursors in a reaction chamber whereby each reactive chemical process fluid is gradually displaced by another reactive chemical process fluid, or where one reactive chemical process fluid is drained from the reaction chamber and another reactive process fluid is introduced into the reaction chamber without rinsing the surfaces of the electronic component precursors with a rinsing fluid between the different chemical treatment steps. The electronic component precursors may be soaked in any given reactive chemical process fluid for a selected period of time.

The term "resistivity," as used herein, is used in its ordinary sense as would be used by persons skilled in the art. See, e.g., *Resistivity* by Akira Yamada in Ultraclean Technology Handbook, Volume 1 (edited by Tadahiro Ohmi published by Marcel Dekker).

As used herein, the terminology "condition temp" is the temperature at which the particular chemical process step is completed. When used in connection with the "dry steps" of the wet processing techniques, the terminology "condition temp" is the temperature of the process fluid in the vessel immediately preceding the introduction of a drying vapor, such as isopropanol (IPA) into the vessel.

As used herein, the terminology "drying time" refers to the length of time that a vapor, such as IPA vapor, flows into the reaction chamber at a given pressure.

The terminology "purge time," as used herein, refers to the time during which the reaction chamber is purged with nitrogen or some other suitable gas to remove any drying vapors or other residuals from the reaction chamber.

The terminology "inject time" and "soak time" are used to describe the time that the electronic component precursors are exposed to the particular chemical. The total "treatment time" is defined as the sum of the inject and the soak time.

The dilution of the particular chemical solutions is defined as the ratio of the water to the chemical.

The methods of the invention are generally applicable to any wet processing equipment including, without limitation, full flow methods, wet benches (baths), and spray cleaning systems. See, e.g., Chapter 1: Overview and Evolution of Semiconductor Wafer Contamination and Cleaning Technology by Werner Kern and Chapter 3: Aqueous Cleaning Processes by Don C. Burkman, Donald Deal, Donald C. Grant, and Charlie A. Peterson in Handbook of Semiconductor Wafer Cleaning Technology (edited by Werner Kern, Published by Noyes Publication Parkridge, N.J. 1993), and Wet Etch Cleaning by Hiroyuki Horiki and Takao Nakazawa in Ultraclean Technology Handbook, Volume 1, (edited by Tadahiro Ohmi published by Marcel Dekker), the disclosures of which are herein incorporated by reference in their entirety. Semiconductor fabrication is described generally, for example, in P. Gise et al., Semiconductor and Integrated Circuit Fabrication Techniques (Reston Publishing Co. Reston, Va. 1979), the disclosures of which are herein incorporated by reference in their entirety.

The reactive chemical process fluids suitable for practicing the invention include, without limitation, aqueous solutions of hydrochloric acid and buffers comprising the same, ammonium hydroxide and buffers comprising the same, hydrogen peroxide, sulfuric acid and buffers comprising the same, mixtures of sulfuric acid and ozone, hydrofluoric acid and buffers comprising the same, chromic acid and buffers comprising the same, phosphoric acid and buffers comprising the same, acetic acid and buffers comprising the same, nitric acid and buffers comprising the same, ammonium fluoride buffered hydrofluoric acid, and combinations thereof. The particular process fluids used, the equipment used, the exposure time, and the experimental conditions (i.e., temperature, concentration, and flow of the process fluid) will vary depending on the particular purpose of the particular wet processing methodology.

For example, the methods of the invention may be used for etching the surfaces of semiconductor wafers to remove any unwanted oxide layer from the silicon surface. The present invention may also be used in controlled oxide etching. Typical etchants for silicon dioxide include, without limitation, hydrofluoric acid, or ammonium fluoride buffered hydrofluoric acid.

Similarly, the present invention may be used with chemical reagents to remove photoresist material from electronic component precursors. Process fluids suitable for these treatments include, without limitation, solutions of sulfuric acid with ozone; sulfuric acid and ozone and/or hydrogen peroxide; inorganic acids such as sulfuric acid, nitric acid, chromic acid, and phosphoric acid; and hydrogen peroxide. Sulfuric/chromic and sulfuric/nitric are typically used at 100° C. Fuming nitric acid, also still in use today, is typically used at room temperature. Preferred process fluids are solutions of sulfuric acid and hydrogen peroxide (referred to as Piranha) and sulfuric acid and ozone (referred to as SOM: Sulfuric Ozone Mixture).

As stated above, the electronic component precursors to be treated in accordance with the methods of the invention may be treated in a variety of reaction chambers, such as baths, vessels, or other wet bench techniques without departing from the spirit of the invention.

It is preferred, that the electronic component precursors treated in accordance with the methods of the invention, be housed in an enclosed vessel (i.e., a "full flow"vessel), preferably such as those disclosed in U.S. Pat. Nos. 4,633,893; 4,917,123; 4,738,272; and 4,577,650, the disclosures of which are herein incorporated by reference in their entirety. Such "full flow methods" are preferred because they result in a more uniform treatment of the electronic component precursors and are more efficient. In addition, often the chemicals utilized in the chemical treatment of electronic component precursors are quite dangerous in that they may be strong acids, alkalis, or volatile solvents. Full flow vessels minimize the hazards associated with such process fluids by avoiding atmospheric contamination and personnel exposure to the chemicals, and by making handling of the chemicals safer. Although vessels as those disclosed in the above-identified U.S. patents are preferred, any such vessels known to persons skilled in the art may be used without departing from the spirit of the invention.

Irrespective of the reaction chamber used, it is generally preferred, that the reaction chamber be installed in a clean room so that the electronic component precursors are not contaminated when being placed in, or removed from, the reaction chamber. It is particularly preferred that the methods of the invention be carried out in reaction chambers that are closed (i.e., the reaction chamber should not be open to the ambient atmosphere except when it is opened to load or unload electronic component precursors). It is further preferred that the reaction chamber be designed so that it becomes hydraulically full during the processes of the present invention. The reaction chamber design should preferably not allow residual ambient atmosphere to be trapped within the reaction chamber after it is closed and filled with reactive chemical process fluids or rinse fluids. Thus, the reaction chamber should preferably not have blind spots, dead-ends, interior surface irregularities or the like where a process fluid or ambient atmosphere could be trapped. These characteristics are undesirable because they increase the likelihood of contaminating the electronic components, reduce the efficiency of treatment processes, and reduce the precision with which the individual processes of the present invention may be varied.

When the electronic component precursors are treated in a bath (as depicted in Prior Art FIG. 2), the wafers, panels, or other electronic precursors would be pulled out of a bath (i.e., 57, 59, 61, 63, 67, 69, 71) and placed in the next bath containing a different reactive process fluid (i.e., some other bath 57, 59, 61, 67, 69, 71). To minimize the effect of contaminating the second bath with the first chemical, the second bath (i.e., 57, 59, 61, 69, 71) may have to be spiked with additional chemical more frequently or replaced more frequently to maintain adequate process control. However, the increased use of chemicals and the associated costs due to the bath gradually becoming contaminated, will be offset by the increase in throughput of the electronic component precursors and the decrease in DI water use. It is contemplated that certain baths may contain a rinse fluid but it is required that at least two of the baths in a sequence contain a reactive chemical process fluid.

Persons skilled in the art would be readily familiar with the technology available to monitor bath concentration such as by using a spectroscopy method. Commercial spectroscopy units are available from Horiba in Kyoto Japan and Kurabo, in Osaka, Japan. Any equipment available for monitoring the reaction chamber conditions may be used without departing from the spirit of the invention.

The electronic component precursors may be dried according to methods known to those skilled in the art, without departing from the spirit of the invention. Examples of such methods are discussed in U.S. Pat. Nos. 4,911,761 and 4,856,544, the disclosures of which are herein incorporated by reference in their entirety.

Generally, in practicing a preferred embodiment of the invention and referring to Prior Art FIG. 1 the electronic component precursors (38) will be placed in a vessel (39) and the reactive chemical process fluids are injected into the flowing DI water stream in line 9, injected through injection parts 19, 21, 23, or 25 will be sequentially introduced into the bottom of reaction chamber 33 and leave through the top of the reaction chamber 41. After the electronic component precursors have been treated with the last reactive chemical process fluid, the process fluid may be evacuated through the bottom of the reaction chamber 33 and a drying vapor may be introduced through line 42 to dry the electronic component precursors. After the electronic component precursors are dried, they can be removed from the reaction chambers. It is also contemplated that the drying step may be performed by directly displacing the process fluids or any rinsing fluids from the reaction chamber with a drying vapor. Drying vapors suitable for practicing the invention include, without limitation, isopropanol. Other methods for drying electronic component precursors are discussed in U.S. Pat. Nos. 4,911,761 and 4,856,544, the disclosures of which are herein incorporated by reference in their entirety.

For purposes of illustration of the methods of the invention, a standard prior art process and a preferred embodiment of the invention will be discussed, both of which use an apparatus illustrated in Prior Art FIG. 1. The wet processing methodologies discussed below are for illustrative purposes only, and are not intended to limit the invention in any way.

In a standard prior art process, using a DI rinse between each chemical treatment step (exposure to a reactive chemical process fluid), the vessel 39 is filled with water flowing in the DI water-in line 9 through the injection manifold incorporating 11, 13, 15, 17, 19, 21, 23, and 25 and through the water-in valve 31. Once the vessel 39 is filled, the temperature and flow of the water stream flowing into the vessel 39 is adjusted through 9 as needed, and then chemical (i.e., $H_2O_2$ and $NH_4OH$) is injected directly into the flowing water via two of the injection ports (i.e., 25 and 23). After the injection is complete, the water-in valve 31 is closed and the electronic component precursors 38 in the vessel 39 are allowed to soak for some time (i.e., the soak time is discussed in further detail in the examples). During the soak, water runs through the DI bypass 45 by opening valve 47. Following the soak, valve 31 is reopened while valve 47 is closed and water is then used to displace the chemical in 39 and rinsing is started. Rinsing continues until the resistivity, as monitored in the drain line 5 with resistivity probe 3, reaches the desired level, indicating that the vessel and electronic component precursors are clean enough. The water temperature and flow is then conditioned again, to reach the temperature and flow required for the second injection. The second injection (i.e., HF) occurs through the appropriate injection valves (i.e., 19). This is then followed by a soak and then a displacement of the chemical through top reaction of chamber 41 and further rinsing. Finally, after the final DI rinse, the water is drained out the bottom of the reaction chamber 3 by way of line 27 (through valve 29) while isopropanol (IPA) vapor is brought in through the top of the reaction chamber 41 through 42.

In the sequential chemical processes of the invention, the DI rinse between each chemical step is not required. In a sequential chemical process of the invention, the vessel fills with DI water through valve 31, conditioning of temperature and flow take place, the first reactive chemical process fluid is injected into DI water stream flowing in 9 via injection lines (i.e., 17, 15). The first reactive chemical flows into the vessel through valve 31 into the vessel. The soak starts by closing valve 31. During the soak, conditioning of flow and temperature of DI water occurs through the DI bypass 45, by opening valve 47. Conditioning occurs only during the soak. At the end of the soak, the valves positions switch (i.e., valve 31 opens and 47 closes) and injection of the next reactive chemical process fluid occurs immediately through injection port 19 so that next reactive chemical process fluid directly displaces the previous reactive chemical process fluid (i.e., no DI water is used to displace chemical in the vessel). These steps or similar steps known to persons skilled in the art may be repeated until the electronic component precursors are properly treated with the appropriate chemicals. Following the chemical treatment steps, the electronic component precursors may be dried as discussed above.

This sequential process method is generally applicable regardless of the kinds and number of process fluids used, and persons skilled in the art would readily know how to use the present invention with any process fluids, once armed with the present disclosure.

For example, in certain embodiments of the invention, the electronic component precursors will be treated with at least three process fluids, wherein the first process fluid is an aqueous solution of hydrogen peroxide and ammonium hydroxide; the second process fluid is an aqueous solution of hydrogen peroxide and hydrochloric acid and the third process fluid is an aqueous solution of hydrofluoric acid. This sequence may also be reversed. This method is particularly useful for cleaning and etching (i.e., removing oxide from the wafer surface). SC1 and SC2 are the same concentrations as set forth elsewhere in this patent. The HF concentration range is 10:1 to 500:1 (Water:HF).

In other embodiments of the invention, the electronic component precursors are treated with a solution of sulfuric acid saturated with ozone, and then with a solution of HF. This method is particularly useful for removing organics and some particulates, while leaving a hydrophobic surface. The sulfuric acid concentration is approximately 98% by weight with as much ozone as can be generated (i.e., 1.74 g/min.). The HF concentration range is 10:1 to 500:1 (Water:HF).

In still other embodiments of the invention, the electronic component precursors are treated with a further series of process fluids: a solution of sulfuric acid saturated with ozone; followed by a solution of hydrogen peroxide and ammonium hydroxide; and then a solution of hydrogen peroxide, hydrochloric acid, and water. This method is particularly useful for the removal of organics as well as general cleaning (i.e., particle removal with minimal metal deposition) leaving a hydrophilic surface. The concentrations set forth elsewhere in this patent are applicable here.

In a particularly preferred embodiment of the invention, the electronic component precursors will be treated with at least two process fluids, wherein the first process fluid is a solution of hydrogen peroxide, ammonium hydroxide, and water (SC1), and the second process fluid is a solution of hydrogen peroxide, hydrochloric acid, and water (SC2). This method is particularly useful for cleaning electronic component precursors, removing particles and light organics, while eliminating metal deposition. Typical concentrations for SC1 range from 5:1:1 (Water: $H_2O_2$:$NH_4OH$) to 200:1:1. Typical concentrations for SC2 range from 5:1:1 to 10000:0:1 (Water: $H_2O_2$:HCl). Typically the standard semiconductor concentration (by weight %) of the chemicals used in the reactive process fluids are as follows: $H_2O_2$ (31%), $NH_4OH$ (28%), HCl (37%), HF (49%), and $H_2SO_4$ (98%).

It is also contemplated that the methods of the invention may be used where only one set of sequential chemical treatment occurs. For example, where the chemical treatment recipe is sulfuric acid (mixed with either peroxide or ozone)/HF/SC1/SC2, and then drying. Traditionally, a DI water rinse is performed between each chemical treatment step. According to the methods of the invention, all of the DI water rinses may be eliminated or maybe only one or two rinses may be done between some, but not all, of the chemical treatment steps regardless of the wet processing technique employed.

As previously stated, traditional wet processing techniques use a DI water rinse between each chemical treatment step to prevent the chemicals from mixing with each other and to prevent contamination of one reactive chemical process fluid with another. The present invention departs from this principle, by not performing a DI water rinse between each chemical treatment step, while still obtaining good process performance and leading to overall cost efficiencies. However, in practicing the present invention, it is desirable to exchange the chemical solutions regularly to achieve reproducible processing. It is particularly preferred that the chemicals be exchanged after one use, while traditionally, chemicals are used for extended use. Adequate performance may be obtained with extended use by spiking (i.e., adding chemical to the second bath) to maintain a relatively constant concentration and pH. This, however, is still more efficient than the traditional techniques that use a DI water rinse between each chemical treatment step. Persons skilled in the art can readily practice any aspect of this invention, once armed with the present disclosure.

The following examples are illustrative of the invention and are not intended to limit the scope of the invention in any way.

EXAMPLES

Example 1

Standard Process Using A DI Rinse

Following is a description of a typical chemical treatment wet processing recipe using a DI water rinse between each chemical treatment step. The wet processing is carried out in CFM Full-Flow™ Wet Processing Equipment available from CFM Technologies, Inc., West Chester, Pa.

The Full-Flow™ wet processing system requires a very different approach to recipe setup than standard wet benches (wet decks). The Full-Flow™ system manipulates the temperature, flow rate, and concentration of reactants in a continuous stream of water. Parameters such as temperature, conductivity, resistivity, and flow rate are continuously monitored, allowing the fine control of the process sequence.

| Parameter | Setpt | Preset | Unit |
|---|---|---|---|
| SC1 - DI Rinse | | | |
| TARGET RESISTIVITY | 16.0 | 16.0 | MOhm |
| TIME AT TARGET | 60.0 | 20.0 | Secs |
| MINIMUM RESISTIVITY | 0.0 | 10.0 | MOhm |
| TIME ABOVE MIN | 1.0 | 3.0 | Mins |
| WARM RINSE FLOW | 4.0 | 5.0 | GPM |
| WARM RINSE TEMP | 65.0 | 35.0 | ° C. |
| WARM RINSE TIME | 30.0 | 60.0 | Secs |
| COOL RINSE FLOW | 4.0 | 10.0 | GPM |
| COOL RINSE TEMP | 65.0 | 25.0 | ° C. |
| COOL RINSE TIME | 30.0 | 60.0 | Secs |
| TIME OPN BLEEDS | 10.0 | 5.0 | Secs |
| DO WARM FIRST | N | N | Y/N |
| END RINSE WARM | N | N | Y/N |
| END RINSE COOL | N | N | Y/N |
| MEGASONICS ON | 0.0 | 0.0 | Secs |
| MEGASONICS OFF | 0.0 | 0.0 | Secs |
| SC1 Inject | | | |
| CONDITION FLOW | 4.0 | 2.0 | GPM |
| CONDITION TEMP | 65.0 | 70.0 | ° C. |
| INJECT TIME | 60.0 | 60.0 | Secs |
| SOAK TIME | 270.0 | 120.0 | Secs |
| RATIO WATER | 40.0 | 7.0 | File |
| RATIO NH4OH | 1.0 | 1.0 | File |
| RATIO H2O2 | 1.5 | 1.0 | File |
| MEGASONICS ON | 60.0 | 0.0 | Secs |
| MEGASONICS OFF | 270.0 | 0.0 | Secs |
| HF - DI Rinse | | | |
| TARGET RESISTIVITY | 16.0 | 16.0 | MOhm |
| TIME AT TARGET | 20.0 | 20.0 | Secs |
| MINIMUM RESISTIVITY | 10.0 | 10.0 | MOhm |
| TIME ABOVE MIN | 3.0 | 3.0 | Mins |
| WARM RINSE FLOW | 8.0 | 5.0 | GPM |
| WARM RINSE TEMP | 35.0 | 35.0 | ° C. |
| WARM RINSE TIME | 45.0 | 60.0 | Secs |
| COOL RINSE FLOW | 12.0 | 10.0 | GPM |
| COOL RINSE TEMP | 35.0 | 25.0 | ° C. |
| COOL RINSE TIME | 45.0 | 60.0 | Secs |
| TIME OPN BLEEDS | 10.0 | 5.0 | Secs |
| DO WARM FIRST | N | N | Y/N |
| END RINSE WARM | N | N | Y/N |
| END RINSE COOL | N | N | Y/N |
| MEGASONICS ON | 0.0 | 0.0 | Secs |
| MEGASONICS OFF | 999.0 | 0.0 | Secs |
| HF Inject | | | |
| CONDITION FLOW | 9.0 | 2.0 | GPM |
| CONDITION TEMP | 30.0 | 70.0 | ° C. |
| INJECT TIME | 60.0 | 60.0 | Secs |
| SOAK TIME | 120.0 | 120.0 | Secs |
| RATIO WATER | 250.1 | 50.0 | File |
| RATO HF | 1.0 | 1.0 | File |
| MEGASONICS ON | 0.0 | 0.0 | Secs |
| MEGASONICS OFF | 0.0 | 0.0 | Secs |
| IPA Dry - DI Rinse | | | |
| TARGET RESISTIVITY | 16.0 | 16.0 | MOhm |
| TIME AT TARGET | 20.0 | 20.0 | Secs |
| MINIMUM RESISTIVITY | 12.0 | 10.0 | MOhm |
| TIME ABOVE MIN | 3.0 | 3.0 | Mins |
| WARM RINSE FLOW | 8.0 | 5.0 | GPM |
| WARM RINSE TEMP | 35.0 | 35.0 | ° C. |
| WARM RINSE TIME | 45.0 | 60.0 | Secs |
| COOL RINSE FLOW | 12.0 | 10.0 | GPM |
| COOL RINSE TEMP | 35.0 | 25.0 | ° C. |
| COOL RINSE TIME | 45.0 | 60.0 | Secs |
| TIME OPN BLEEDS | 10.0 | 5.0 | Secs |
| DO WARM FIRST | N | N | Y/N |
| END RINSE WARM | N | N | Y/N |
| END RINSE COOL | N | N | Y/N |
| MEGASONICS ON | 0.0 | 0.0 | Secs |
| MEGASONICS OFF | 0.0 | 0.0 | Secs |

-continued

| Parameter | Setpt | Preset | Unit |
|---|---|---|---|
| IPA Dry | | | |
| CONDITION FLOW | 3.0 | 2.0 | GPM |
| CONDITION TEMP | 45.0 | 70.0 | ° C. |
| DRYING TIME | 8.0 | 8.0 | Mins |
| VSL PRESSURE | 1.5 | 1.5 | PSI |
| PURGE TIME | 3.0 | 3.0 | Mins |

Example 2

Sequential Chemical Process

Following is a description of a typical chemical treatment wet processing recipe using sequential chemical processing. The wet processing is carried out in CFM Full-Flow™ Wet Processing Equipment available from CFM Technologies, Inc., West Chester, Pa.

a. SC1-HF-Dry

| Parameter | Setpt | Preset | Unit |
|---|---|---|---|
| SC1 - DI Rinse | | | |
| TARGET RESISTIVITY | 0.0 | 16.0 | MOhm |
| TIME AT TARGET | 300.0 | 20.0 | Secs |
| MINIMUM RESISTIVITY | 0.0 | 10.0 | MOhm |
| TIME ABOVE MIN | 5.0 | 3.0 | Mins |
| WARM RINSE FLOW | 15.0 | 5.0 | GPM |
| WARM RINSE TEMP | 31.5.0 | 35.0 | ° C. |
| WARM RINSE TIME | 45.0 | 60.0 | Secs |
| COOL RINSE FLOW | 5.0 | 10.0 | GPM |
| COOL RINSE TEMP | 45.0 | 25.0 | ° C. |
| COOL RINSE TIME | 45.0 | 60.0 | Secs |
| TIME OPN BLEEDS | 10.0 | 5.0 | Secs |
| DO WARM FIRST | N | N | Y/N |
| END RINSE WARM | N | N | Y/N |
| END RINSE COOL | N | N | Y/N |
| MEGASONICS ON | 0.0 | 0.0 | Secs |
| MEGASONICS OFF | 0.0 | 0.0 | Secs |
| SC1 Inject | | | |
| CONDITION FLOW | 5.0 | 2.0 | GPM |
| CONDITION TEMP | 45.0 | 70.0 | ° C. |
| INJECT TIME | 60.0 | 60.0 | Secs |
| SOAK TIME | 5060.0 | 120.0 | Secs |
| RATIO WATER | 80.0 | 7.0 | File |
| RATIO NH4OH | 1.0 | 1.0 | File |
| RATIO H2O2 | 2.0 | 1.0 | File |
| MEGASONICS ON | 0.0 | 0.0 | Secs |
| MEGASONICS OFF | 0.0 | 0.0 | Secs |
| HF - DI Rinse (Initial Rinse) | | | |
| TARGET RESISTIVITY | none | none | MOhm |
| TIME AT TARGET | none | none | Secs |
| MINIMUM RESISTIVITY | none | none | MOhm |
| TIME ABOVE MIN | none | none | Mins |
| WARM RINSE FLOW | none | none | GPM |
| WARM RINSE TEMP | none | none | ° C. |
| WARM RINSE TIME | none | none | Secs |
| COOL RINSE FLOW | none | none | GPM |
| COOL RINSE TEMP | none | none | ° C. |
| COOL RINSE TIME | none | none | Secs |
| TIME OPN BLEEDS | none | none | Secs |
| DO WARM FIRST | none | none | Y/N |
| END RINSE WARM | none | none | Y/N |
| END RINSE COOL | none | none | Y/N |
| MEGASONICS ON | none | none | Secs |
| MEGASONICS OFF | none | none | Secs |

-continued a. SC1-HF-Dry

| Parameter | Setpt | Preset | Unit |
|---|---|---|---|
| HF Inject | | | |
| CONDITION FLOW | 8.0 | 2.0 | GPM |
| CONDITION TEMP | 30.0 | 70.0 | ° C. |
| INJECT TIME | 90.0 | 60.0 | Secs |
| SOAK TIME | 10.0 | 120.0 | Secs |
| RATIO WATER | 50.0 | 50.0 | File |
| RATIO HF | 1.0 | 1.0 | File |
| MEGASONICS ON | 0.0 | 0.0 | Secs |
| MEGASONICS OFF | 0.0 | 0.0 | Secs |
| IPA Dry - DI Rinse | | | |
| TARGET RESISTIVITY | 16.0 | 16.0 | MOhm |
| TIME AT TARGET | 20.0 | 20.0 | Secs |
| MINIMUM RESISTIVITY | 12.0 | 10.0 | MOhm |
| TIME ABOVE MIN | 3.0 | 3.0 | Mins |
| WARM RINSE FLOW | 8.0 | 5.0 | GPM |
| WARM RINSE TEMP | 35.0 | 35.0 | ° C. |
| WARM RINSE TIME | 45.0 | 60.0 | Secs |
| COOL RINSE FLOW | 12.0 | 10.0 | GPM |
| COOL RINSE TEMP | 35.0 | 25.0 | ° C. |
| COOL RINSE TIME | 45.0 | 60.0 | Secs |
| TIME OPN BLEEDS | 10.0 | 5.0 | Secs |
| DO WARM FIRST | N | N | Y/N |
| END RINSE WARM | N | N | Y/N |
| END RINSE COOL | N | N | Y/N |
| MEGASONICS ON | 0.0 | 0.0 | Secs |
| MEGASONICS OFF | 999.0 | 0.0 | Secs |
| IPA Dry | | | |
| CONDITION FLOW | 3.0 | 2.0 | GPM |
| CONDITION TEMP | 55.0 | 70.0 | ° C. |
| DRYING TIME | 8.0 | 8.0 | Mins |
| VSL PRESSURE | 1.5 | 1.5 | PSI |
| PURGE TIME | 3.0 | 3.0 | Mins |

Example 3

Process Results For The Chemical Treatment Of Wafers With SC1-HF Chemical Process Fluids With A DI Water Rinse Between The SC1 And The HF Chemical Treatments It has been observed that particles are deposited on the wafers and the vessels when a DI water rinse is performed after the SC1 chemical treatment, as described in Example 1. The particles are generally deposited in patterns that "match" the fluid flow lines in the vessel. This indicates that the particles are likely to occur in areas of the vessel where there is unsatisfactory rinsing of the reactive chemical process fluids.

The data shows that for the SC1-HF sequence, it was only possible to get good process results (little or no precipitation) when an extensive rinse (about 15–20 minutes) was introduced between the SC1 and the HF step. See Tables 1 and 2 below and FIG. 3b. In general, each particle is the result of a precipitate remaining of the water. Therefore high particle counts result from high levels of precipitation.

TABLE 1

Data From SC1/HF Standard Processing

| Standard Rinse Data Run Number | Average Number of Particles (>0.16 μm) added per wafer |
|---|---|
| 1 | 540 |
| 2 | 375 |
| 3 | 257 |

TABLE 1-continued

Data From SC1/HF Standard Processing

| Standard Rinse Data Run Number | Average Number of Particles (>0.16 μm) added per wafer |
|---|---|
| 4 | 557 |
| 5 | 945 |
| 6 | 373 |

TABLE 2

Data From SC1/HF With Extended Rinsing

| Extended Rinse Data Run Number | Average Number of Particles (>0.16 μm) added per wafer |
|---|---|
| 1 | 35 |
| 2 | 18 |
| 3 | 20 |
| 4 | 97 |
| 5 | 34 |
| 6 | 197 |
| 7 | 115 |
| 8 | 25 |
| 9 | 43 |

Example 4

Process Results For The Chemical Treatment Of Wafers With SC1-HF Chemical Process Fluids Using Sequential Chemical Processing (No DI Rinse Between The SC1 And The HF Chemical Treatments)

Wafers were treated using the sequential processing methods of the invention, as described in Example 2.

Figure 3B:
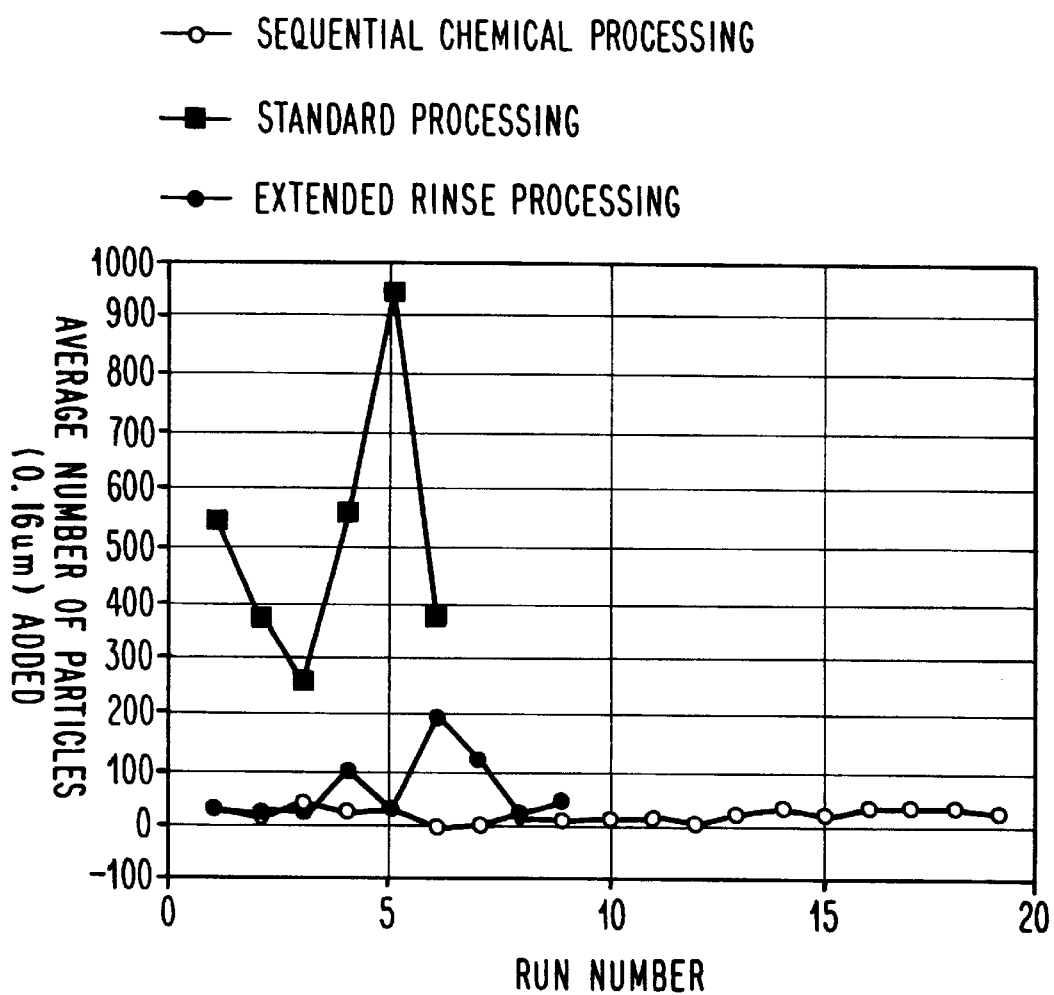
Figure 4:
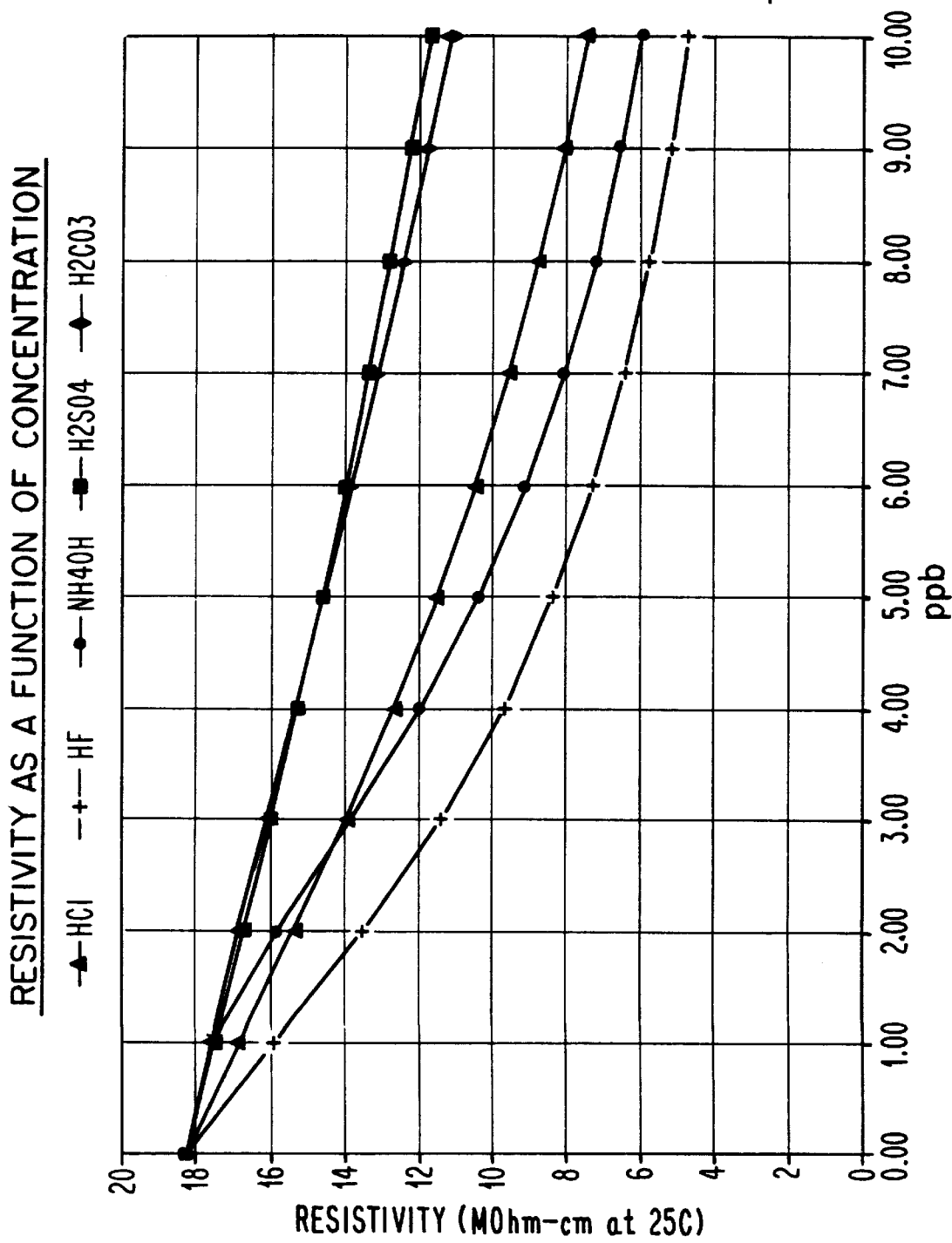
FIG. 4 is a graphical representation of resistivity as a function of concentration.

The data shows that by eliminating the rinsing step between two reactive chemical process fluids, the precipitation is prevented. See, e.g., Table 3 and FIG. 3a. FIG. 3a shows the particle addition numbers after using an SC1-HF process without any DI rinsing between the two chemical steps. As shown in FIG. 3a, initially the particle counts were high, but after an initial clean-up period, the process where the SC1 chemical mixture is directly displaced by HF showed very low particle counts (on the order of 50 particles added at 0.16 μm) indicating excellent particle performance.

TABLE 3

Data from SC1/HF sequential chemical processing

| Run Number | Number of wafers in vessel | Average Number of Particles (>0.16 up) Added per Wafer | Maximum Number of Particles (>0.16 up) Added per Wafer |
|---|---|---|---|
| 1 | 26 | +20 | +33 |
| 2 | 26 | +36 | +41 |
| 3 | 26 | +22 | +31 |
| 4 | 26 | +22 | +29 |
| 5 | 26 | −7 | +29 |
| 6 | 26 | −3 | +1 |
| 7 | 26 | +21 | +23 |
| 8 | 26 | +12 | +21 |
| 9 | 26 | +11 | +25 |
| 10 | 26 | +21 | +42 |
| 11 | 26 | +15 | +34 |
| 12 | 26 | +25 | +50 |
| 13 | 26 | +38 | +53 |
| 14 | 26 | +26 | +31 |
| 15 | 26 | +34 | +36 |
| 16 | 26 | +37 | +48 |

TABLE 3-continued

Data from SC1/HF sequential chemical processing

| Run Number | Number of wafers in vessel | Average Number of Particles (>0.16 up) Added per Wafer | Maximum Number of Particles (>0.16 up) Added per Wafer |
|---|---|---|---|
| 17 | 26 | +34 | +43 |
| 18 | 26 | +23 | +39 |

Example 5

Conditions For Running A Sequential Exposures Using An Apparatus of FIG. 1

The methods of the invention may be used with any of the following chemical treatment steps. The following tables show examples of chemical process steps that are run in the apparatus shown in Prior Art FIG. 1. Process steps may be able to be run sequentially without DI rinses between each chemical step.

In the recipes that follow, the ratio of the water to the chemical gives Full-Flow 8050 made by CFM Technologies Inc.

| Parameter | Setpt | Preset | Unit |
|---|---|---|---|
| a.1 SC1/SC2/Dry-SC1 Inject SC1 Inject | | | |
| CONDITION TEMP | 65.0 | 70.0 | C. |
| INJECT TIME | 60.0 | 60.0 | Secs |
| SOAK TIME | 270.0 | 120.0 | Secs |
| RATIO WATER | 40.0 | 7.0 | File |
| RATIO NH4OH | 1.0 | 1.0 | File |
| RATIO H2O2 | 1.5 | 1.0 | File |
| a.2 SC1/SC2/Dry-SC2 Inject SC2 Inject | | | |
| CONDITION TEMP | 45.0 | 70.0 | C. |
| INJECT TIME | 60.0 | 60.0 | Secs |
| SOAK TIME | 240.0 | 120.0 | Secs |
| RATIO WATER | 40.0 | 7.0 | File |
| RATIO HCL | 1.5 | 1.0 | File |
| RATIO H2O2 | 1.0 | 1.0 | File |
| a.3 SC1-SC2 Dry-IPA Dry IPA Dry | | | |
| CONDITION FLOW | 3.0 | 2.0 | GPM |
| CONDITION TEMP | 55.0 | 70.0 | C. |
| DRYING TIME | 8.0 | 8.0 | Mins |
| VSL PRESSURE | 1.5 | 1.5 | PSI |
| PURGE TIME | 3.0 | 3.0 | Mins |
| b.1 HF/SC1/SC2/Dry-HF Inject HF Inject | | | |
| CONDITION TEMP | 30.0 | 70.0 | C. |
| INJECT TIME | 60.0 | 60.0 | Secs |
| SOAK TIME | 120.0 | 120.0 | Secs |
| RATIO WATER | 250.0 | 50.0 | File |
| RATIO HF | 1.0 | 1.0 | File |
| b.2 HF SC1/SC2/Dry - SC1 Inject SC1 Inject | | | |
| CONDITION TEMP | 65.0 | 70.0 | ° C. |
| INJECT TIME | 60.0 | 60.0 | Secs |
| SOAK TIME | 140.0 | 120.0 | Secs |
| RATIO WATER | 80.0 | 7.0 | File |
| RATIO NH4OH | 1.0 | 1.0 | File |
| RATIO H2O2 | 3.5 | 1.0 | File |

-continued

| Parameter | Setpt | Preset | Unit |
|---|---|---|---|
| SC2 Inject | | | |
| CONDITION TEMP | 35.0 | 70.0 | ° C. |
| INJECT TIME | 60.0 | 60.0 | Secs |
| SOAK TIME | 150.0 | 120.0 | Secs |
| RATIO WATER | 80.0 | 7.0 | File |
| RATIO HCL | 1.0 | 1.0 | File |
| RATIO H2O2 | 2.0 | 1.0 | File |
| IPA Dry | | | |
| CONDITION FLOW | 3.0 | 2.0 | GPM |
| CONDITION TEMP | 55.0 | 70.0 | ° C. |
| DRYING TIME | 8.0 | 8.0 | Mins |
| VSL PRESSURE | 1.5 | 1.5 | PSI |
| PURGE TIME | 3.0 | 3.0 | Mins |

What is claimed is:

1. A method for wet processing semiconductor wafers comprising:

a) placing the semiconductor wafers in a liquid displacement reaction chamber;

b) providing a volume of a first reactive process liquid to the reaction chamber, wherein the first reactive process liquid comprises at least one first chemical, and wherein the first chemical has a concentration greater than 100 ppm in the first reactive process liquid and is selected from the group consisting of hydrochloric acid and buffers comprising the same, ammonium hydroxide and buffers comprising the same, hydrogen peroxide, sulfuric acid and buffers comprising the same, mixtures of sulfuric acid and ozone, hydrofluoric acid and buffers comprising the same, chromic acid and buffers comprising the same, phosphoric acid and buffers comprising the same, acetic acid and buffers comprising the same, nitric acid and buffers comprising the same, and combinations thereof;

c) contacting the surfaces of the semiconductor wafers with the first reactive process liquid for a first selected period of time without removing the semiconductor wafers from the reaction chamber;

d) directly displacing the volume of the first reactive process fluid by providing a second reactive process liquid to the reaction chamber, wherein the second reactive process liquid comprises at least one second chemical, wherein the second chemical has a concentration greater than 100 ppm in the second reactive process liquid and is selected from the group consisting of hydrochloric acid and buffers comprising the same, ammonium hydroxide and buffers comprising the same, hydrogen peroxide, sulfuric acid and buffers comprising the same, mixtures of sulfuric acid and ozone, hydrofluoric acid and buffers comprising the same, chromic acid and buffers comprising the same, phosphoric acid and buffers comprising the same, acetic acid and buffers comprising the same, nitric acid and buffers comprising the same, and combinations thereof, and wherein at least one of the chemicals in the first reactive process liquid is absent from the second reactive process liquid; and e) contacting the surfaces of the semiconductor wafers with the second reactive process liquid for a second selected period of time without removing the semiconductor wafers from the reaction chamber, wherein the second reactive process liquid sequentially follows the first reactive process liquid without any intervening contact with a rinsing liquid between the contacting of the semiconductor wafers with the first reactive process liquid and the second reactive process liquid.

2. The method of claim 1 wherein the first reactive process liquid does not contain hydrofluoric acid.

3. The method of claim 2 wherein the first reactive process liquid is an aqueous solution comprising the first chemical selected from the group consisting of hydrochloric acid, ammonium hydroxide, hydrogen peroxide, sulfuric acid, mixtures of sulfuric acid and ozone, mixtures of sulfuric acid and hydrogen peroxide, mixtures of hydrogen peroxide and ammonium hydroxide, and mixtures of hydrogen peroxide and hydrochloric acid; and the second reactive process liquid is an aqueous solution comprising the second chemical selected from the group consisting of hydrochloric acid, ammonium hydroxide, hydrogen peroxide, sulfuric acid, hydrofluoric acid, buffered hydrofluoric acid, mixtures of sulfuric acid and ozone, mixtures of hydrogen peroxide and ammonium hydroxide, and mixtures of hydrogen peroxide and hydrochloric acid.

4. The method of claim 3 wherein the first chemical is selected from the group consisting of mixtures of hydrogen peroxide and ammonium hydroxide, sulfuric acid, mixtures of sulfuric acid and ozone, and mixtures of sulfuric acid and hydrogen peroxide; and the second chemical is selected from the group consisting of hydrochloric acid, hydrofluoric acid, buffered hydrofluoric acid, and mixtures of hydrogen peroxide and hydrochloric acid.

5. The method of claim 4 wherein the first chemical is selected from the group consisting of ammonium hydroxide and hydrogen peroxide; and the second chemical is selected from the group consisting of hydrofluoric acid, buffered hydrofluoric acid, and mixtures of hydrogen peroxide and hydrochloric acid.

6. The method of claim 3 wherein the first chemical is selected from the group consisting of hydrochloric acid, and mixtures of hydrogen peroxide and hydrochloric acid; and the second chemical is selected from the group consisting of hydrofluoric acid, buffered hydrofluoric acid, and mixtures of hydrogen peroxide and ammonium hydroxide.

7. The method of claim 1 wherein the first reactive process liquid is an aqueous solution comprising the first chemical selected from the group consisting of hydrofluoric acid, buffered hydrofluoric acid and combinations thereof; and the second reactive process liquid is an aqueous solution comprising the second chemical selected from the group consisting of hydrochloric acid, and mixtures of hydrogen peroxide and hydrochloric acid.

8. The method of claim 1 wherein the reaction chamber is a full flow vessel.

9. The method of claim 1 further comprising the step of drying the semiconductor wafers in the reaction chamber without removing the semiconductor wafers from the reaction chamber.

10. The method of claim 1 comprising the step of repeating step d) with additional reactive process liquids.

11. The method of claim 1 further comprising the step of contacting the semiconductor wafers with a rinsing liquid before contacting the semiconductor wafers with the first reactive process liquid, or after contacting the semiconductor wafers with the second reactive process liquid.

12. In a method for wet processing semiconductor wafers where semiconductor wafers are placed in a vessel, the vessel is closed to the environment, and the semiconductor wafers are contacted with a series of process liquids by displacing one process liquid with another process liquid, without removing the semiconductor wafers from the vessel, the improvement comprising the steps of:

a) filling the vessel with a volume of a first reactive process liquid, wherein the first reactive process liquid comprises a first carrier liquid and at least one first chemical having a concentration greater than 100 ppm in the first reactive process liquid;

b) contacting the surfaces of the semiconductor wafers with the first reactive process liquid for a selected period of time, wherein the first chemical in the first reactive process liquid reacts with the surfaces of the semiconductor wafers to remove contaminants bound to the surfaces of the semiconductor wafers, remove photoresist, grow an oxide layer, or etch the surfaces of the semiconductor wafers;

c) removing the volume of the first reactive process liquid from the vessel by directly displacing substantially all of the volume of the first reactive process liquid with a second reactive process liquid, wherein the second reactive process liquid comprises a second carrier liquid and at least one second chemical having a concentration of at least 100 ppm in the second reactive process liquid, wherein at least one of the chemicals in the first reactive process liquid is absent from the second reactive process liquid; and d) contacting the surfaces of the semiconductor wafers with the second reactive process liquid for a second selected period of time without removing the semiconductor wafers from the reaction chamber, wherein the second chemical in the second reactive process liquid reacts with the surfaces of the semiconductor wafers to remove contaminants bound up the surfaces of the semiconductor wafers, remove photoresist, grow an oxide layer, or etch the surfaces of the semiconductor wafers.

13. The method of claim 12 wherein the first reactive process liquid does not contain hydrofluoric acid.

14. The method of claim 13 wherein the first and second carrier liquids comprise deionized water, the first chemical is selected from the group consisting of hydrochloric acid, ammonium hydroxide, hydrogen peroxide, sulfuric acid, mixtures of sulfuric acid and ozone, mixtures of sulfuric acid and hydrogen peroxide, mixtures of hydrogen peroxide and ammonium hydroxide, and mixtures of hydrogen peroxide and hydrochloric acid, and the second chemical is selected from the group consisting hydrochloric acid, ammonium hydroxide, hydrogen peroxide, sulfuric acid, hydrofluoric acid, buffered hydrofluoric acid, mixtures of sulfuric acid and ozone, mixtures of hydrogen peroxide and ammonium hydroxide, and mixtures of hydrogen peroxide and hydrochloric acid.

15. The method of claim 14 wherein the first chemical is selected from the group consisting of mixtures of hydrogen peroxide and ammonium hydroxide, sulfuric acid, mixtures of sulfuric acid and ozone, and mixtures of sulfuric acid and hydrogen peroxide, and the second chemical is selected from the group consisting of hydrochloric acid, hydrofluoric acid, buffered hydrofluoric acid, and mixtures of hydrogen peroxide and hydrochloric acid.

16. The method of claim 15 wherein the first chemical is selected from the group consisting of ammonium hydroxide and hydrogen peroxide; and the second chemical is selected from the group consisting of hydrofluoric acid, buffered hydrofluoric acid, and mixtures of hydrogen peroxide and hydrochloric acid.

17. The method of claim 14 wherein the first chemical is selected from the group consisting of hydrochloric acid, and mixtures of hydrogen peroxide and hydrochloric acid, and the second chemical is selected from the group consisting of hydrofluoric acid, buffered hydrofluoric acid, and mixtures of hydrogen peroxide and ammonium hydroxide.

18. The method of claim 12 wherein the first and second carrier liquids comprise deionized water, the first chemical is selected from the group consisting of hydrofluoric acid, buffered hydrofluoric acid and combinations thereof, and the second chemical is selected from the group consisting of hydrochloric acid, and mixtures of hydrogen peroxide and hydrochloric acid.

* * * * *